TRANSISTORS AND CIRCUITS THEREFOR

Filed May 20, 1955 2 Sheets-Sheet 1

INVENTOR.
RICHARD F. RUTZ
BY [signature]
ATTORNEY

INVENTOR.
RICHARD F. RUTZ
BY [signature]
ATTORNEY

United States Patent Office 2,995,665
Patented Aug. 8, 1961

2,995,665

TRANSISTORS AND CIRCUITS THEREFOR

Richard F. Rutz, Fishkill, N.Y., assignor to International Business Machines Corporation, New York, N.Y., a corporation of New York Filed May 20, 1955, Ser. No. 509,851
6 Claims. (Cl. 307—88.5)

This application is a continuation-in-part of my earlier application, Serial No. 458,619, filed September 27, 1954, now United States Patent No. 2,889,499, issued June 2, 1959, entitled "Bistable Semiconductor Device."

The present invention relates to transistors and circuits therefor, and particularly to transistors and circuits of relatively high current carrying capacity, and having, in addition to the usual base, collector and emitter electrodes, at least one more electrode which may function at times as an emitter and at other times as a collector.

There is disclosed in my copending application referred to above, a transistor comprising first and second regions of opposite conductivity types separated by a boundary junction, with the thickness of the first region substantially equal to or less than the diffusion length for the average lifetime of minority carriers in that one region. The second region is formed of material having a resistivity substantially lower than (e.g. about one-tenth) that of the first region so as to insure efficient injection of minority carriers into the first region. The second region is covered substantially over its entire surface with a low resistance, ohmically conductive layer, and is made thin enough to provide an equipotential connection to the whole area of the junction. A collector having high intrinsic current amplification is in electrical contact with the first region on the opposite side thereof from the junction. A suitable base connection is provided to the same side of the first region contacted by the collector.

An object of the present invention is to provide improved transistors of the general type described in my copending application.

Another object is to provide improved circuits for such transistors.

Another object is to provide a point contact transistor structure which is not critical as to the spacing between the emitter and collector electrodes.

Another object of the invention is to provide a transistor structure having at least one electrode which may function as either an emitter or a collector, and improved means for controlling the characteristics of that electrode.

Another object is to provide an improved logical circuit employing a transistor of the type described.

The foregoing and other objects of the invention are attained, in the structures described herein, by providing a transistor body including a region of one conductivity type joined at a boundary junction to one or two other regions of opposite conductivity type. The thickness of the first region is made substantially equal to or less than the diffusion length for the average lifetime of minority carriers in that region.

In one modification of the invention, the region of opposite conductivity type includes two portions respectively located directly opposite emitter and collector contacts which are made to the opposite side of the one region. These two portions may be physically separate, or they may be portions of one continuous region. This modification may be used in circuits similar to those adapted for use with a conventional point contact transistor. However, the spacing between the collector and emitter is not critical, as in the conventional transistor. This modification may alternatively be connected to form a logical circuit.

In another modification of the invention, there is only one region of the opposite conductivity type, and it has an annular contour. A point contact emitter is aligned with the center of the annulus and a collector is connected to the one region directly opposite the emitter.

In either modification, the region of opposite conductivity type, or a portion of it, may serve at times as an emitter and at times as a collector.

In several embodiments of the invention, the transistor has a conventional emitter which is effective at all current outputs, and the boundary junction becomes an effective emitter as the current output increases, thereby further increasing the output and providing an extremely high current amplification.

Other objects and advantages of the invention will become apparent from a consideration of the following description and claims, taken together with the accompanying drawings.

*FIGURE 1*

Figure 1:
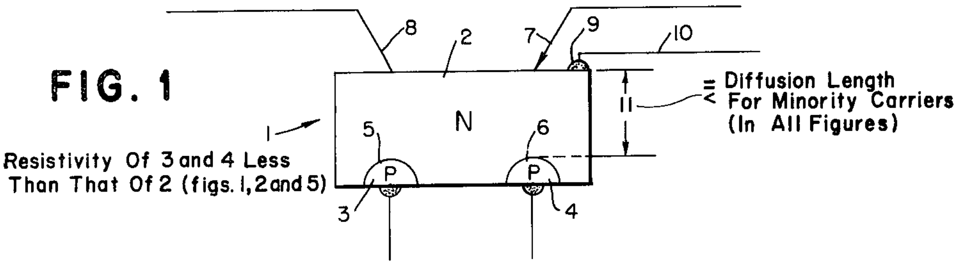
FIG. 1 is a somewhat diagrammatic representation of a transistor embodying the present invention.

There is shown in this figure a transistor 1 having a body of semi-conductive material including an N region 2 and two smaller P regions 3 and 4 alloyed into the underside of the N region 2. The regions 3 and 4 are separated from the N region by boundary junctions 5 and 6 respectively.

A point contact emitter 7 is in electrical contact with the N region 2 at a point directly opposite the P region 4. A point contact collector 8 is in electrical contact with the N region 2 at a point directly opposite the P region 3. Other conventional collector structures may be used, as long as they have a high intrinsic current amplification, i.e. at least greater than 1, and preferably greater than $1+b$, where $b$ is the mobility ratio in the N region 2. If the region contacted by the collector is a P region, the intrinsic current amplification should preferably be greater than $1+1/b$. The high alpha collector may be either an electro-formed point contact of wire having an N type impurity, or the collector wire may be actually welded or fused to the N region 2, for instance by using a gold wire with 1% antimony as an impurity, and so forming a permanently bonded high intrinsic alpha collector. Alternatively, a PN hook collector may be used. An ohmic connection 9 is made to the N region 2. This may be a soldered connection with a wire 10, and may serve as a base connection. The spacing between the emitter 7 and collector 8 on the one hand and the junctions 5 and 6 on the other hand must be substantially equal to or less than the diffusion length for the average lifetime of minority carriers in the N region 2. This dimension is indicated by the reference numeral 11 in the drawing.

FIG. 1 shows the P regions 3 and 4 in profile. In plan view, they may appear as substantially circular spots, so that the two P regions are separated by a central portion of the N region 2.

The P regions 3 and 4 must have a resistivity low as compared to that of N region 2, in order to ensure good hole injection from the junctions 5 and 6 into the N region. For example, where the N region 2 has a resistivity of 5 ohm-cm., the P regions 3 and 4 should have a resistivity of about 0.5 ohm-cm.

In the circuits described below, one or more of the connections illustrated in FIG. 1 may be omitted, if not used in a particular circuit.

*FIGURE 2*

In this circuit, the transistor 1 of FIG. 1 is connected so that it acts as a conventional point contact transistor, but without the usual limitation as to the maximum spacing between the point contact emitter and the point contact collector. The collector 8 is connected through a load resistor 12 and a load supply battery 13 to ground. The base connection 9 is grounded. The P regions 3 and 4 are connected through a wire 16. An output terminal 17 is connected to collector 8 and another output terminal 18 is connected to ground. Emitter 7 is connected through a resistor 19 to an input terminal 20. Another input terminal 21 is grounded.

Figure 2:
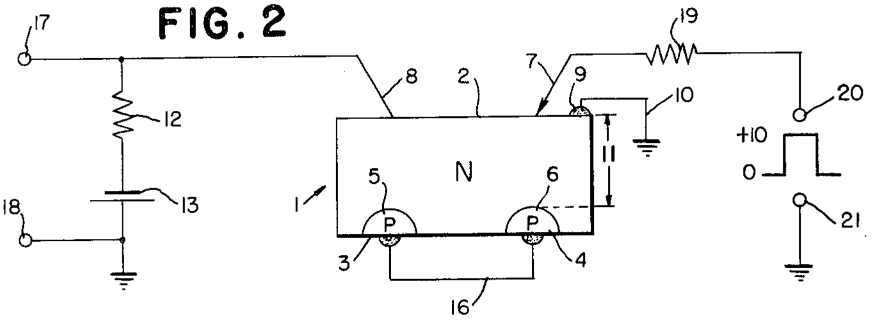
FIG. 2 is an electrical wiring diagram showing the transistor of FIG. 1 connected in a circuit.

When the transistor 1 is connected in the circuit of FIG. 2, it has typical point contact transistor characteristics. However, there is no maximum limitation as to the spacing between the emitter 7 and the collector 8, as in conventional point contact transistors. The absence of this limitation may be explained by considering that the transistor 1 functions as two individual transistors connected in cascade. The emitter 7, the N region 2 and the P region 4 form a first one of these two individual transistors, in which the junction 6 serves as the collector. The second one of the two individual transistors includes the P region 3, the N region 2 and the collector 8. The junction 5 serves as an emitter for the second transistor, which is connected as a load on the output of the first transistor. It may be seen that in each of these two individual transistors, the spacing between the emitter and collector is definitely fixed by the dimensions in the transistor body. Since the two transistors are conductively connected by wire 16, the lateral spacing between the emitter 7 and collector 8 is immaterial.

The battery 13 biases the collector 8 to a substantial negative potential. When the transistor is Off, most of the potential gradient between collector 8 and the grounded base 9 appears in the N region 2 closely adjacent the collector 8. The rest of the N region 2 is at a slightly negative potential which decreases in value toward the grounded base 9. The potential in the N region 2 just outside the junction 5 may be, for example, −0.3 volt and the potential in the N region 2 just outside the junction 6 may be, for example, 0.1 volt. The two P regions 3 and 4 are then at an intermediate value between those two potentials, for example, −0.2 volt. The junction 5 is then biased forwardly by a very small potential, and the junction 6 is then biased reversely. Although the junction 5 may emit a few electrons by virtue of its forward bias, the reverse biased junction 6 in series with it will severely limit the current flow through the junction 5 and the transistor can not turn On.

Now assume that a substantial positive signal is applied between the terminals 20 and 21, for example, 10 volts. Emitter 7 becomes strongly positively biased and emits holes into the N region 2. These holes diffuse across the N region reaching the junction 6, which serves as a collector. The resulting current at the junction 6 flows through the conductor 16 to the P region 3, and the junction 5 emits holes which diffuse across the N region 2 to the collector 8, thereby turning the transistor On.

When the positive input signal at emitter 7 terminates, the potential gradient in the N region 2 is determined chiefly by the electron current flowing from collector 8 to base 9. This again becomes effective to bias junction 6 reversely, thereby cutting off the current flow through junction 5 and the emission of holes therefrom, turning the transistor Off.

The foregoing description of the operation of the circuit of FIG. 2 assumes that collector 8 is spaced from emitter 7 by a distance greater than a diffusion length. The operation is substantially the same if that spacing is less than a diffusion length, except that there are then two paths for holes moving between emitter 7 and collector 8, namely, the one described above and the direct path, which is like that of a conventional transistor. Hence, it may be seen that for the transistor 1 when used in the circuit of FIG. 2, there is no maximum nor minimum limitation as to the spacing between emitter 7 and collector 8, except that they must not be in contact. It should therefore be apparent that the manufacture of such transistors is considerably simpler than the manufacture of conventional transistors.

The operation is substantially the same if the grounded base 9 is located adjacent the collector 8 rather than adjacent the emitter 7. If that modification is employed, there is substantially no potential gradient between the junctions 5 and 6, and consequently neither junction can function efficiently as either a collector or emitter so that the current flowing through the transistor is negligibly small in the absence of a positive input signal. The response of the transistor to a positive input signal is substantially the same as in the case discussed in detail above.

*FIGURE 3*

This figure illustrates a transistor 22 which may be substituted for the transistor 1 of FIG. 2. The transistor 22 comprises an N region 23 and a P region 24 extending across the entire lower side of the P region 23 and joined thereto by a boundary junction 25. The thickness of the N region 23 is subject to the same limitation as the thickness of the N region 2 in FIG. 1. The P region 24 is of low resistivity as compared to that of N region 23. A low resistance contact **24*a* extends over substantially the entire surface of region 24, so that it operates as an equipotential region. A point contact emitter 26, a point contact collector 27 and an ohmic base connection 28 are provided. The portions of the large P region 24 opposite the emitter 26 and collector 27 respectively perform the function of the P regions 4 and 3 of FIG. 2, and the intervening portion of P region 24 performs the function of the conductor 16. When transistor 22 is connected in the circuit of FIG. 2 in place of transistor 1, the circuit functions in substantially the same manner. The spacing between the point contact electrodes 26 and 27** is again immaterial.

*FIGURE 4*

This figure illustrates a modification of the circuit of FIG. 2, which is connected to operate as a logical circuit. Those elements in FIG. 4 which correspond to their counterparts in FIG. 2 have been given the same reference numerals and will not be further described.

Figure 4:
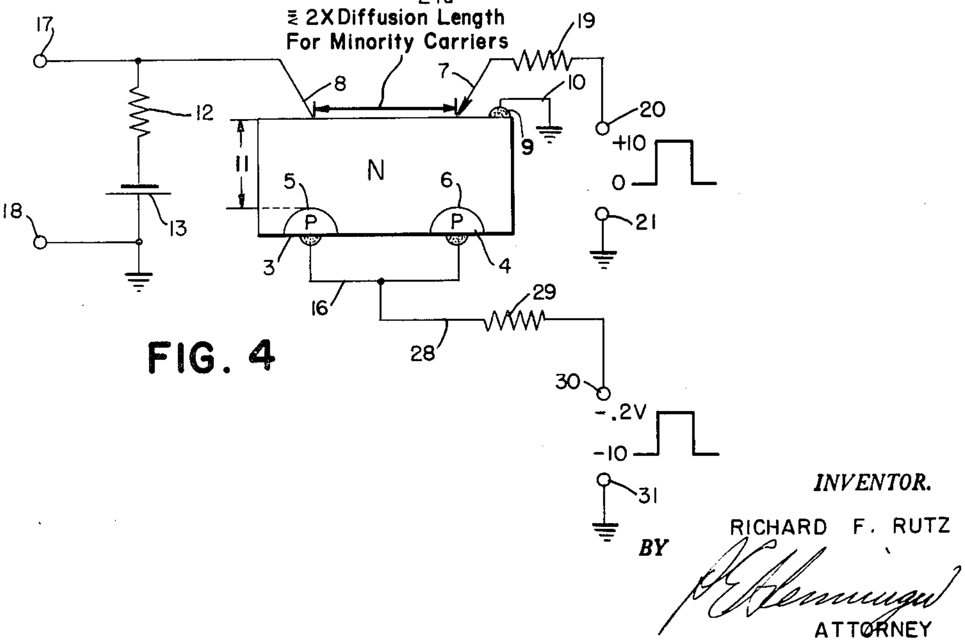
FIG. 4 is an electrical wiring diagram showing a logical circuit which is a modification of the circuit of FIG. 2.

The circuit of FIG. 4 differs from the circuit of FIG. 2 by the addition of an input connected to the wire 16. This input includes a wire 28, a resistor 29 and input terminals 30 and 31, the latter being grounded.

Resistor 29 should be high (e.g. 10K ohms) as compared to the forward resistance of junction 5 so as to limit the current available through it to a small, substantially constant value.

As in the circuit of FIG. 2, input signals shifting between a "no signal" value of 0 volts and a "signal" value of +10 volts are received at the terminals 20 and 21. The circuit of FIG. 4 has a second set of input terminals 30 and 31, shiftable between a no-signal potential of —10 volts and a signal potential of slightly below 0, e.g. —0.2 volt. As long as the input terminal 30 remains at —10 volts, then the PN junction 5 is reversely biased and the left-hand or "second" transistor can not conduct current. Consequently, signals appearing at the input terminals 20 and 21 are not transmitted through the transistor 1 and do not appear at the output terminals 17 and 18. Furthermore, as long as the input terminal 20 remains at 0 volts, emitter 7 is reverse biased, and a shift of input terminal 30 from —10 volts to —0.2 volt is not effective to remove the reverse bias from junction 5.

When both sets of input terminals receive positive-going signals, i.e. when input terminal 20 swings to +10 volts and input terminal 30 swings to —0.2 volt, then the emitter 7 becomes strongly positively biased and emits holes which diffuse across the N region 2 to the junction 6. Junction 6 is then reverse biased and acts as a collector, the current collected there flowing through the wire 16 to the P region 3 and being emitted as holes at the junction 5, which is now slightly forwardly biased and is receiving a substantial current supply. The current flow through the junction 5 appears in the N region 2 principally as holes, which diffuse across the N region 2 to the collector 8, so that the transistor switches to its On or strongly conducting condition, producing a substantial output signal at terminals 17 and 18.

Both sets of input terminals must continue at their "signal" values in order to maintain the transistor On. If terminal 20 goes to 0 volts, then the potential gradient due to the electron current flow from collector 8 to grounded base 9 again controls the bias on the junction 6 and it becomes reverse biased, limiting the hole current through junction 5 to the small value available through resistor 29, and the transistor goes Off. Likewise, if terminal 30 goes to —10 volts, the transistor cuts Off, since junction 5 becomes strongly reverse biased.

Figure 3:
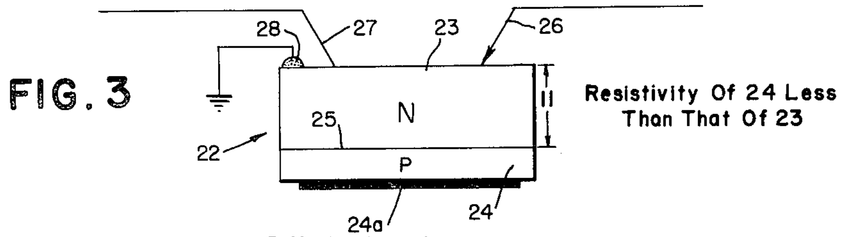
FIG. 3 is a diagrammatic illustration of a somewhat different type of transistor structure which may be used in place of that of FIG. 2 in the circuit of FIG. 2.

It may be seen that the circuit just described is connected to function as a logical circuit, specifically as a coincidence or AND circuit. Signals must be received simultaneously at both input terminals in order to produce a signal at the output. As is well understood in the art, this circuit may be made to serve as a mixing circuit or OR circuit by changing the polarity and logical significance of the input signals. For example, if the no-signal value at each set of input terminals was 0 volts and the signal value +5 volts, then a signal would be produced at output terminals 17 and 18, whenever a signal was received at either set of input terminals. The transistor 22 of FIG. 3 may be used in the circuit of FIG. 4 alternatively to the transistor 1.

In FIG. 4, the spacing between emitter 7 and collector 8 should be at least twice the diffusion length for the average lifetime of minority carriers in the region 2. Otherwise, the input terminals 30 and 31 could have no control over the output signal.

Figure 5:
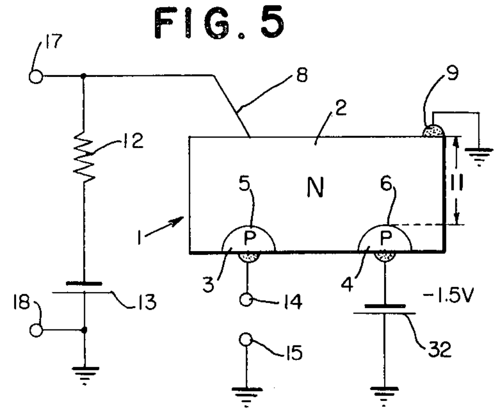
FIG. 5 is an electrical wiring diagram of another form of circuit employing the transistor of FIG. 1.
Figure 6:
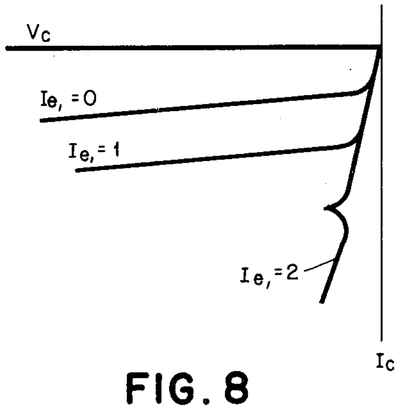
FIG. 6 is a graphical illustration of the operating characteristics of the circuit of FIG. 5.

*FIGURES 5 and 6*

These figures illustrate another circuit employing the transistor 1 and having very high current amplification characteristics.

In this circuit, PN junction 5 is employed as an emitter, in a manner similar to the circuit of FIG. 2, and the PN junction 6 functions at times as a second collector and at other times as a second emitter. The junction 6 is biased reversely by means of a battery 32, so that it tends to function as a collector. Square wave input signals are received at terminals 14 and 15, connected respectively to the P-region 3 and to ground. At low current flows through the emitter junction 5, holes are injected which on arrival at the high alpha collector 8 cause an electron current to flow to the base 9. This current is accompanied by a potential drop across the N region from collector 8 to base 9, but the N region near the P region 4 is not sufficiently negative to forward bias junction 6. The emitter junction 6 remains off, and the collector current-potential characteristics have the forms shown in FIG. 6 for low values of current ($I_{e_1}$) through emitter junction 5. As the current flow through emitter junction 5 increases, the potential drop across that junction increases, and a potential gradient is established in the N region 2 such that the potential in the portion of N region 2 adjacent the junction 6 drops to a value lower than that of the negative terminal of biasing battery 32. Junction 6 then becomes forwardly biased and emits holes in the N region 2, thereby substantially increasing the current flow through that region and likewise increasing the current flow through the collector 8. This increased current flow produces a further decrease in potential of the N region 2, and the effect becomes cumulative, the collector current increasing rapidly, so that a very high current amplification may be reached.

Since the junction 6 is located at a distance from collector 8 which may be greater than the diffusion length, holes emitted from that junction may reach the collector only when an accelerating field is present, such as that due to the potential gradient. The proportion of the total holes emitted at junction 6 which reaches the collector depends upon the strength of that field.

As soon as the positive injut signal at emitter junction 5 ceases, the emission of holes at that junction ceases and the electron current between the collector 8 and grounded base 9 is reduced. The potential gradient between collector 8 and base 9 becomes smaller, reducing the forward bias on the junction 6, thereby further reducing the emission of holes from that junction, which in turn reduces the electron current flow further, the action becoming cumulative. When the bias on the junction 6 due to the potential gradient falls below the potential of the biasing battery 32, that battery becomes effective to reverse bias that junction, so that it begins to act as a collector, being effective to "clean up" the holes in its immediate neighborhood, thereby shifting the transistor quickly to its Off condition. This hole clean-up is of particular value when the transistor is used with pulse type inputs, since the output is thereby made to cut Off quickly when the input swings Off.

Figure 7:
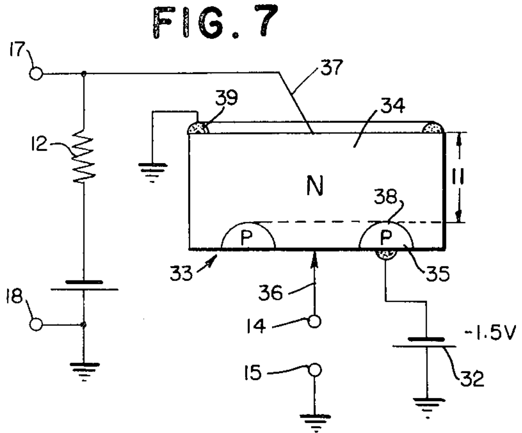
FIG. 7 is a wiring diagram of a circuit similar to that of FIG. 5, employing a somewhat different form of transistor structure.
Figure 8:
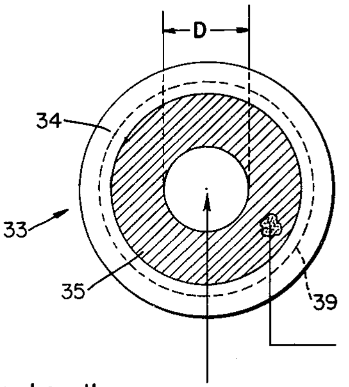
FIG. 8 is a somewhat diagrammatic bottom plan view of the transistor used in the circuit of FIG. 7.

*FIGURES 7 and 8*

These figures illustrate a circuit similar to that of FIG. 5, but using a modified form of transistor 33. The transistor 33 comprises an N region 34, and a single annular P region 35. The resistivity of region 35 is less than that of region 34, being comparable to the relative resistivities of the regions 3 and 4 on the one hand and the region 2 on the other hand in FIG. 1. A point contact emitter 36 is in engagement with the N region 34 at the center of the annulus formed by the P region 35. A point contact collector 37 is in contact with the N region 34 directly opposite the emitter 36. The P region 35 and the PN junction 38 serve at times as a second collector and at other times as a second emitter, being biased reversely, i.e. as a collector, by battery 32. A base connection 39 is made annular, so that it will be symmetrical with junction 38, and the potential gradient will be symmetrical about the axis between emitter 36 and collector 37. The annular region 35 may be on either surface of the transistor, as long as it is substantially centered on that axis. As long as the reverse bias battery 32 is employed, the inner diameter D (see FIG. 8) of the region 35 has no definite minimum limit.

The functioning of the circuit of FIG. 7 is substantially the same as that of the circuit of FIG. 5. The emitter junction 38 does not affect back resistance of the collector until the current flow through the first emitter 36 is appreciable. This is also true of junction 6 in the arrangement of FIG. 5. These transistors therefore provide a very high current amplification characteristic combined with a high back resistance under low current and cut off conditions.

If the inner diameter D of the annular region 35 is made great enough so that the distance between junction 38 and collector 37 is substantially greater than the diffusion length for the average lifetime of minority carriers in the N region 34, then holes will diffuse from the junction 38 to the collector 37 only when there is an accelerating field due either to the current flow from emitter 36 to collector 37, or to the current flow from collector 37 to base 39. Under such conditions, the operation of the transistor 33 is substantially the same as that described above for transistor 1 in the circuit of FIG. 5. When the positive input signal terminates, the emission of holes from the junction 38 rapidly decreases until the biasing battery 32 becomes effective to reverse bias that junction, whereupon it acts as a collector thereby cleaning up holes in its immediate vicinity.

It may sometimes be desirable to provide a thyratron type of operation, as described in my copending application Serial No. 458,619, mentioned above. This may be accomplished by making the inner diameter D of the annular region 35 substantially smaller than the diffusion length, so that a current flow once initiated, is effective to maintain itself even if the input signal has terminated. In such an arrangement, external means must be provided to interrupt the circuit, as described in my aforesaid copending application.

*FIGURE 9*

This figure illustrates a modification of the circuit of FIG. 7, in which the ohmic base connection 39 is connected through a wire 40 to the P region 35, and both are connected to ground. The operation of this circuit is similar to that of FIG. 7, except that no bias is employed on the junction 38. Emission of holes from junction 38 to collector 37 is cut off under low current conditions by the difference in the distance between emitter 36 and collector 37 on the one hand and the distance between junction 38 and the collector 37 on the other hand. The spacing across the inside of the annulus formed by P region 35 is substantially twice the diffusion length for the average lifetime of minority carriers in the N region 34, as illustrated by the dimension 41 in FIG. 8. Consequently, when the electric field between emitter 36 and collector 37 is small or very low, minority current carriers can reach collector 37 only from emitter 36 and not from junction 38.

Figure 9:
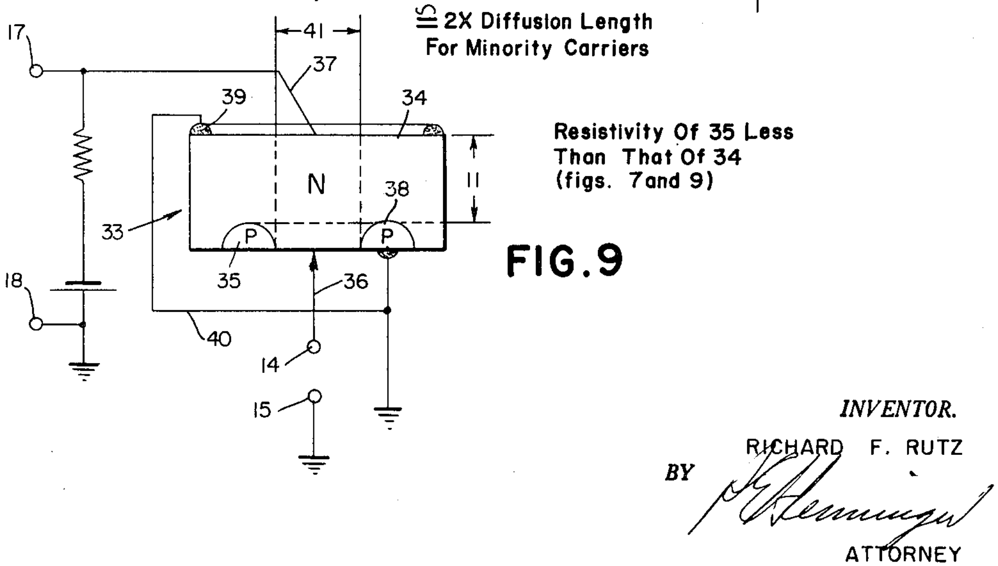
FIG. 9 is an electrical wiring diagram of another circuit employing the transistor of FIGS. 7 and 8.

In the circuit of FIG. 9, the thyratron action described above in connection with FIG. 7 will be secured if the inner diameter of the annular region 35 is made less than twice the diffusion length for the average lifetime of minority carriers in the N region 34.

While I have shown and described certain preferred embodiments of my invention, other modifications thereof will readily occur to those skilled in the art, and I therefore intend my invention to be limited only by the appended claims.

I claim:

1. A transistor comprising a body of semi-conductive material having a first region of one conductivity type, collector means having a high intrinsic current amplification and in electrical contact with said first region, a second region in said body of opposite conductivity type to said first region and separated therefrom by a first boundary junction, said second region having a resistivity substantially lower than said first region, so that said junction may emit minority carriers to said first region, said junction serving as an emitter and being spaced from said collector means by a distance substantially no greater than the diffusion length for the average lifetime of minority carriers in said one region, and a third region in said body of said opposite conductivity type and separated from said first region by a second boundary junction, said third region having a resistivity substantially lower than said first region, so that said second junction may emit minority carriers to said first region, said second junction being spaced from said collector means by a distance substantially greater than said diffusion length, so that minority carriers emitted from said second junction may reach the collector means only when an accelerating field is present.

2. A transistor circuit including a transistor comprising a body of semi-conductive material having a first region of one conductivity type, collector means having a high intrinsic current amplification and in electrical contact with said first region, a second region in said body of opposite conductivity type to said first region and separated therefrom by a first boundary junction, said second region having a resistivity substantially lower than said one region, so that said junction may emit minority carriers to said first region, said junction serving as an emitter and being spaced from said collector means by a distance substantially no greater than the diffusion length for the average lifetime of minority carriers in said one region, an ohmic electrical connection to said one region, said connection being spaced from said collector means and from said junction, and a third region in said body of said opposite conductivity type and separated from said first region by a second boundary junction, said third region having a resistivity substantially lower than said first region, so that said second junction may emit minority carriers to said first region, said second junction being spaced from said collector means by a distance substantially greater than said diffusion length, so that minority carriers emitted from said second junction may reach the collector means only when an accelerating field is present, means connecting said ohmic connection to a common point, a load impedance and a source of electrical potential connected in series between said collector means and said common point, said source being poled to bias said collector means reversely, means connecting said third region to said common point, a source of electrical signals connected between said second region and said common point, said signal source being poled so that said signals bias said first boundary junction forwardly and cause emission of minority carriers therefrom into said first region, said carriers being attracted by said collector means and cooperating therewith and with said ohmic connection to produce an accelerating field between said second junction and said collector means, and thereby to increase the emission of carriers from said second junction and to enhance the current amplification of the transistor.

3. A transistor circuit as defined in claim 2, in which said last-mentioned connecting means includes means to bias said second junction reversely, and thereby to inhibit emission of carriers therefrom unless the current flow due to said signals produces an accelerating field strong enough to overcome said biasing means, said reverse biasing means being effective in the absence of a signal from said signal source to cause said second junction to act as a collector and to attract minority carriers from said first region.

4. Transistor apparatus comprising a body of semi-conductive material having opposed major surfaces and including a first region of one conductivity type on one of said surfaces, collector means having a high intrinsic current amplification and in electrical contact with said first region, a second region in said body of opposite conductivity type to said first region and separated therefrom by a first boundary junction, said second region being on the opposite one of said major surfaces and having a resistivity substantially lower than said first region, so that said junction may emit minority carriers to said first region, said junction serving as an emitter and being spaced from said collector means by a distance substantially no greater than the diffusion length for the average lifetime of minority carriers in said one region, and a third region in said body of said opposite conductivity type and separated from said first region by a second boundary junction, said third region being on said opposite major surface and having a resistivity substantially lower than said first region, so that said second junction may emit minority carriers to said first region, said second junction being spaced from said collector means by a distance greater than the spacing between said first junction and said collector means, and means effective in the absence of an accelerating field between said first junction and said collector means to inhibit movement of carriers from said second junction to said collector means.

5. Transistor apparatus as defined in claim 4, in which said carrier movement inhibiting means comprises the portion of said first region between the second junction and the collector means, said portion providing a spacing between the second junction and the collector means, substantially greater than said diffusion length.

6. Transistor apparatus as defined in claim 4, in which said carrier movement inhibiting means comprises means reversely biasing said second junction.

References Cited in the file of this patent

UNITED STATES PATENTS

| | | |
|---|---|---|
| 2,476,323 | Rack | July 19, 1949 |
| 2,570,978 | Pfann | Oct. 9, 1951 |
| 2,586,080 | Pfann | Feb. 19, 1952 |
| 2,597,028 | Pfann | May 20, 1952 |
| 2,623,105 | Shockley et al. | Dec. 23, 1952 |
| 2,666,814 | Shockley | Jan. 19, 1954 |
| 2,672,528 | Shockley | Mar. 16, 1954 |
| 2,754,431 | Johnson | July 10, 1956 |
| 2,793,145 | Clarke | May 21, 1957 |
| 2,795,744 | Kircher | June 11, 1957 |
| 2,801,348 | Pankove | July 30, 1957 |